United States Patent [19]

Herlein et al.

[11] Patent Number: 4,675,562

[45] Date of Patent: Jun. 23, 1987

[54] METHOD AND APPARATUS FOR DYNAMICALLY CONTROLLING THE TIMING OF SIGNALS IN AUTOMATIC TEST SYSTEMS

[75] Inventors: Richard F. Herlein, San Jose; Jeffrey A. Davis, Santa Clara; E. James Cotriss, San Jose, all of Calif.

[73] Assignee: Fairchild Semiconductor Corporation, Cupertino, Calif.

[21] Appl. No.: 611,451

[22] Filed: May 17, 1984

Related U.S. Application Data

[63] Continuation-in-part of Ser. No. 518,499, Aug. 1, 1983, abandoned.

[51] Int. Cl.⁴ .................. H03K 3/86; H03K 17/26
[52] U.S. Cl. ............................. 307/602; 307/603; 307/595; 307/243; 328/55; 328/109; 328/104
[58] Field of Search ............... 328/104, 109, 137, 154, 328/55, 56; 307/602, 603, 605, 606, 608, 595, 596, 518, 243

[56] References Cited

U.S. PATENT DOCUMENTS 3,659,207  4/1972  Perreault ........................... 328/14
3,675,049  7/1972  Haven ............................. 307/293
4,488,297 12/1984  Vaid ............................... 371/1

FOREIGN PATENT DOCUMENTS 54-162945 12/1979  Japan .
2010552   6/1979  United Kingdom .
2045561  10/1980  United Kingdom .

OTHER PUBLICATIONS

"Analysis and Definition of Overall Timing Accuracy in VLSI Test System," 1981 IEEE Test Conference, Paper 7.5, pp. 143–153.

Primary Examiner—John S. Heyman
Assistant Examiner—Richard Roseen
Attorney, Agent, or Firm—Theodore S. Park; Bruce D. Riter; Robert C. Colwell

[57] ABSTRACT

Apparatus for delaying an electrical signal includes a sequence of stages, each for delaying the signal. A coarser stage delays the signal by multiples of a predetermined fundamental delay interval and a finer stage provides for fine adjustment of the delay. The fine stage includes an integral number N of delay elements, the total providing a delay interval greater than the fundamental delay interval, whereby the fine delay intervals compensate for fabrication tolerances to enable accurate calibration of the combined system by post-fabrication measurement. In one implementation each delay stage includes a tapped transmission line to provide delay intervals, in another a ramp generator is used.

13 Claims, 6 Drawing Figures

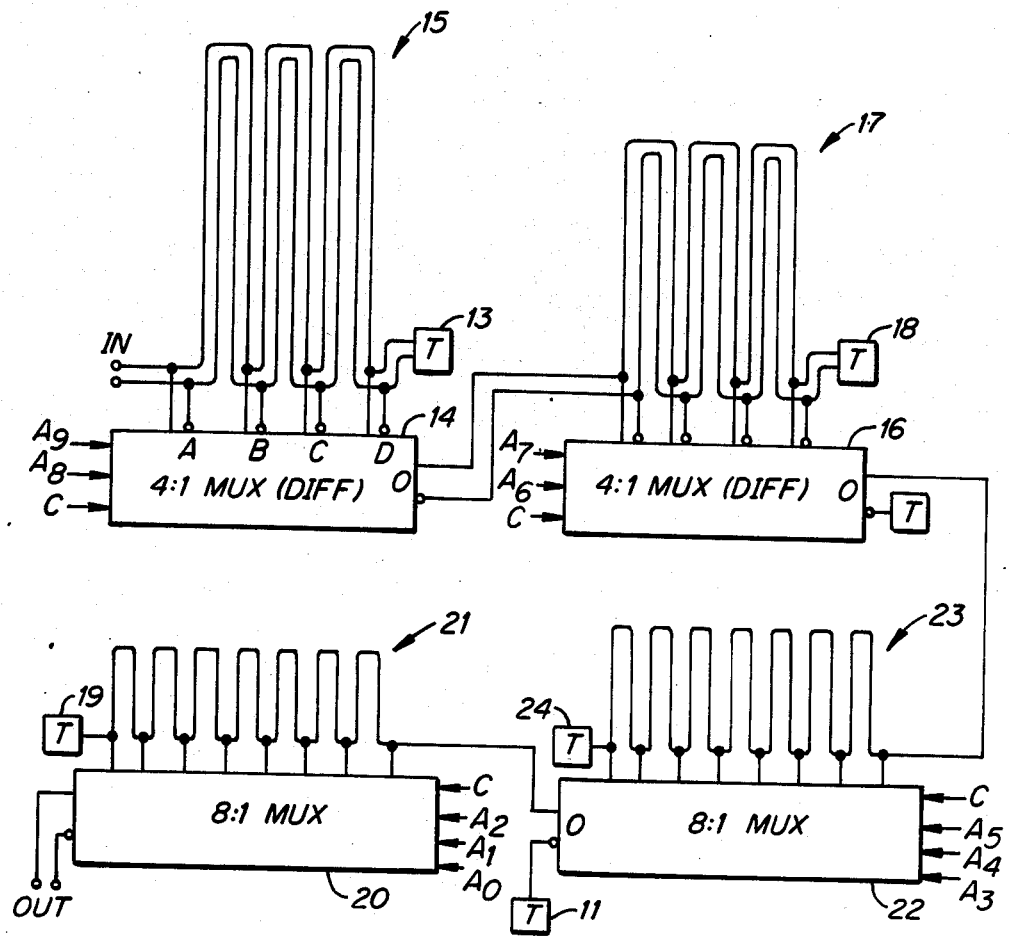
FIG._1.
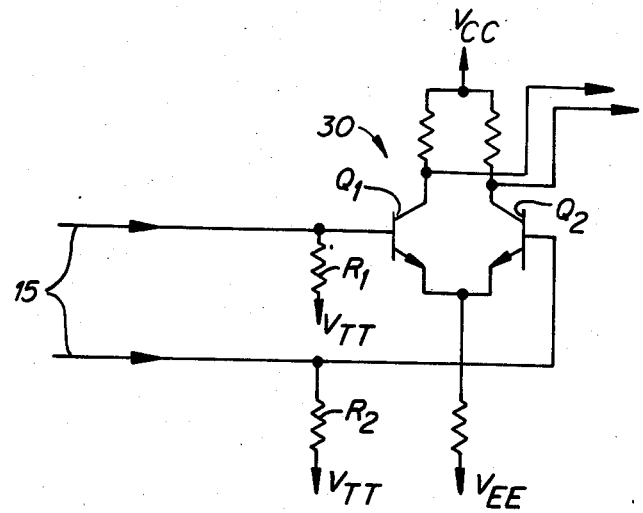
FIG._2.

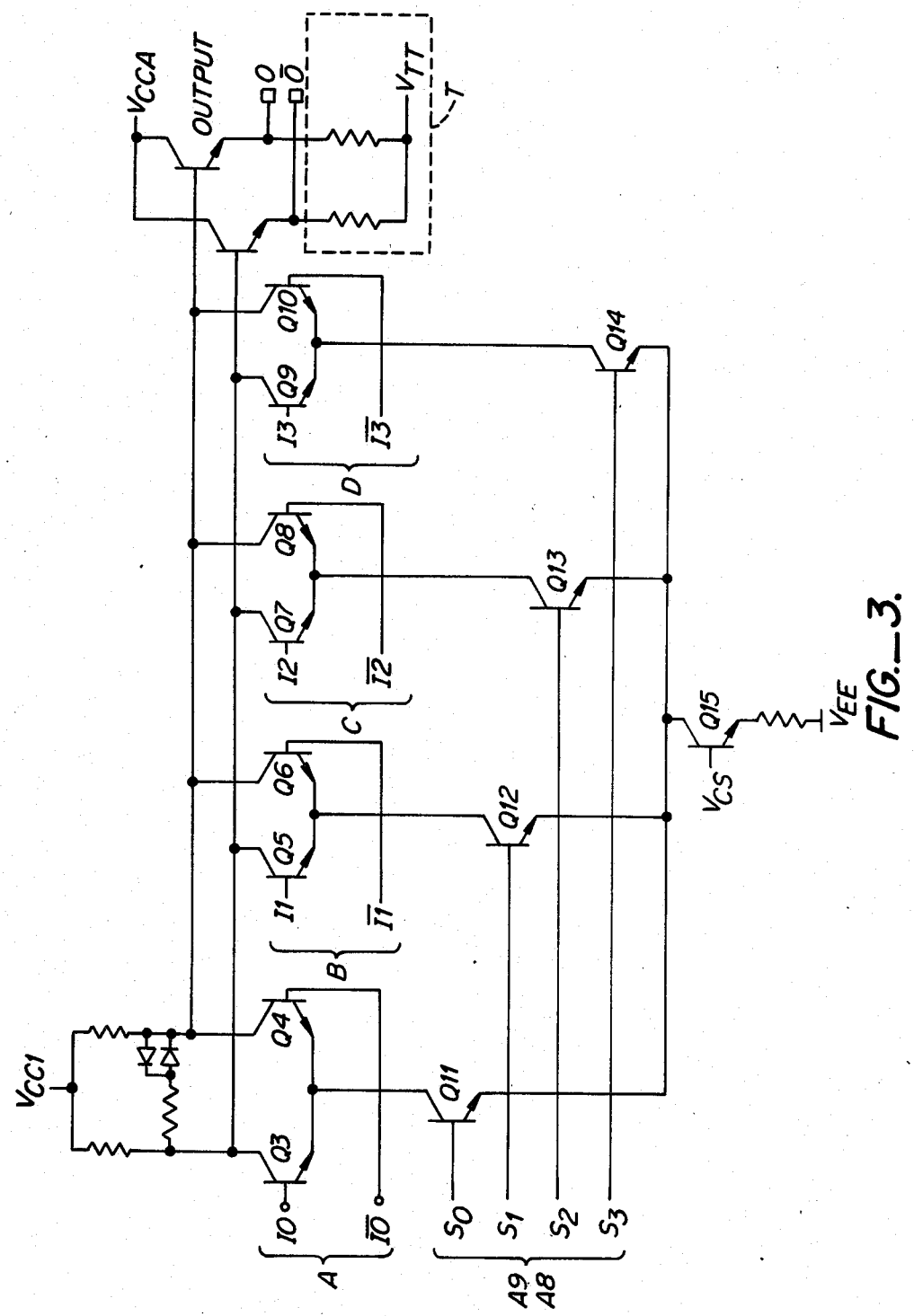

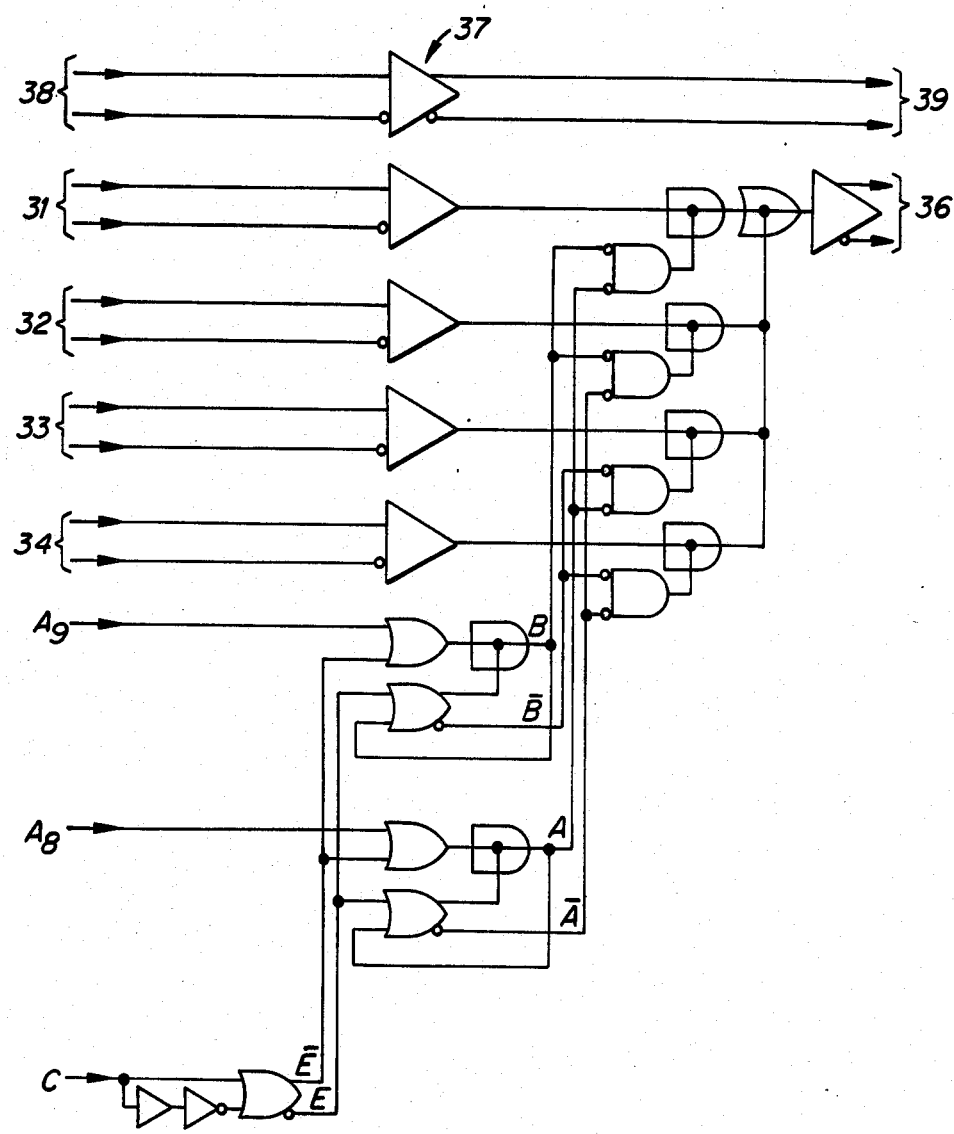
FIG._4.

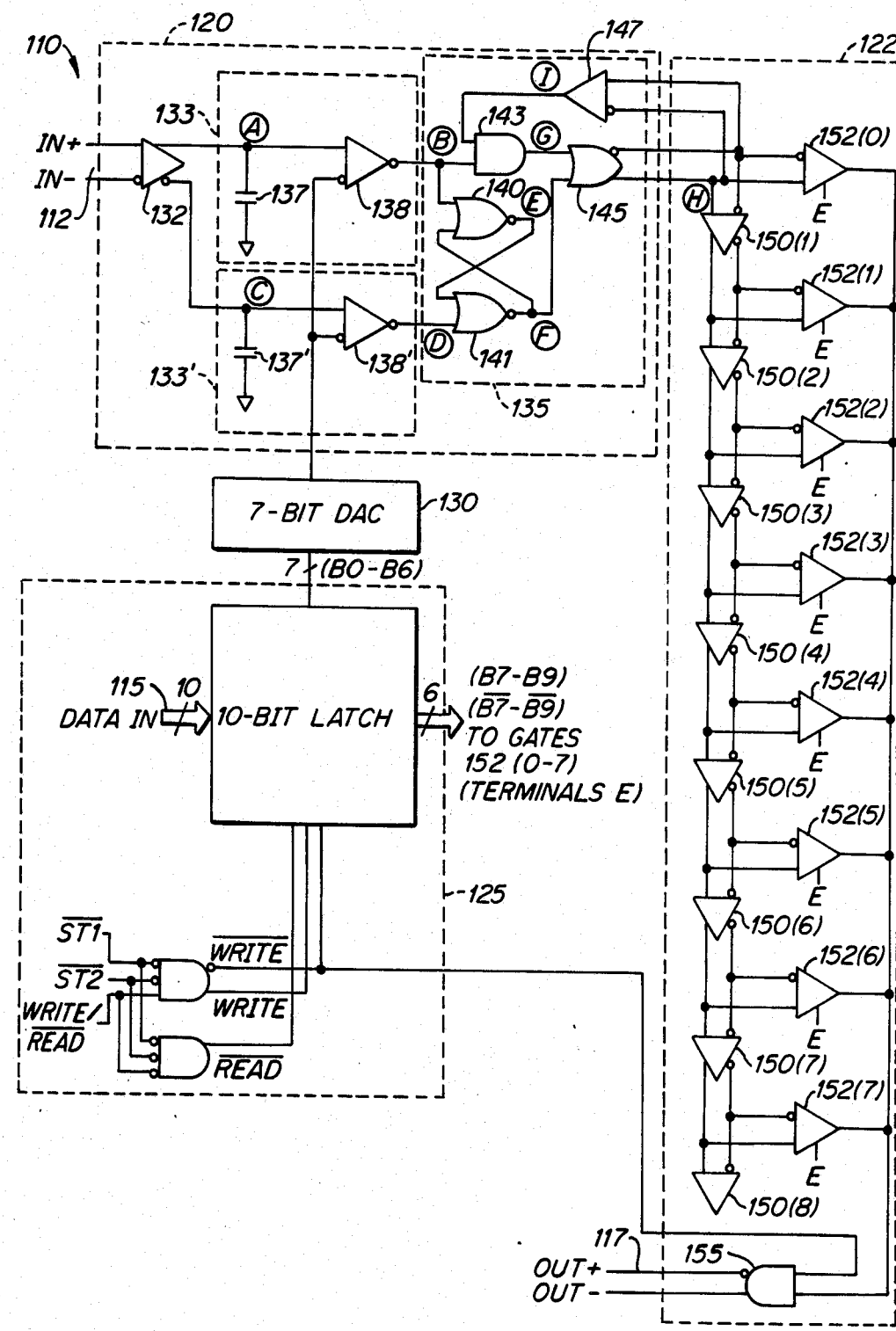
FIG._5.

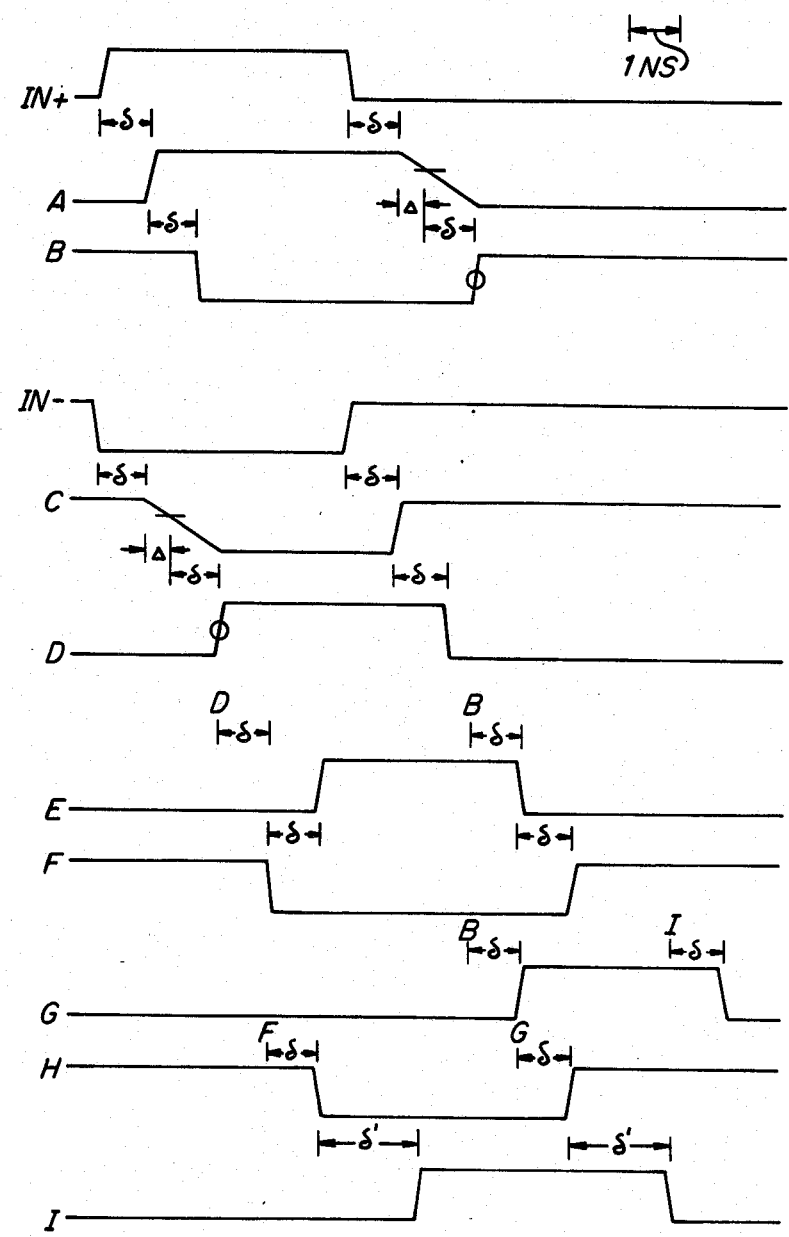
FIG._6.

METHOD AND APPARATUS FOR DYNAMICALLY CONTROLLING THE TIMING OF SIGNALS IN AUTOMATIC TEST SYSTEMS

REFERENCE TO RELATED APPLICATION

This application is a continuation-in-part of prior U.S. application Ser. No. 518,499 filed Aug. 1, 1983, and entitled "High Speed Test System," now abandoned. This application is related to U.S. patent application Ser. No. 611,266, entitled "Temperature Stabilized Gate"; Ser. No. 611,267, entitled "Test Period Generator for Automatic Test Equipment"; Ser. No. 611,445, entitled "Method and Apparatus for Applying and Monitoring Programmed Test Signals During Automated Testing of Electronic Circuits"; Ser. No. 611,446, entitled "Formatter for High Speed Test System"; Ser. No. 611,448, entitled "Method and Apparatus for Monitoring Response Signals During Automated Testing of Electronic Circuits"; Ser. No. 611,449, entitled "Method and Apparatus for Monitoring Automated Testing of Electronic Circuits"; Ser. No. 611,452, entitled "Gate Having Balanced Node"; Ser. No. 611,453, entitled "Control of Signal Timing Apparatus in Automatic Test Systems Using Minimal Memory"; and Ser. No. 611,454, entitled "Multiple Stage Gate Network."

BACKGROUND OF THE INVENTION

1. Field of the Invention

The invention relates to automatic test equipment used to test integrated circuits. In particular, the invention is directed to a method and apparatus for dynamically controlling the timing of signals in such test equipment, including synchronizing or deskewing a plurality of signals to be supplied to, or received from, an integrated circuit being tested.

2. Description of the Prior Art

With the development of increasingly complicated integrated circuits there is a corresponding increase in the demands made upon test equipment used for quality control or evaluation of the completed devices. An example of such test equipment is the automated Sentry ® series of testers manufactured by Fairchild Camera & Instrument Corporation. In automatic test equipment input signals are applied to selected pins of an integrated circuit being tested (usually known as device under test), which in response produces output signals at other selected pins. The test equipment automatically senses the response of the device under test and analyzes the response signals for their compliance with quality-control standards.

In general, the automatic test equipment has the capabilities of applying a precisely controlled preprogrammed electrical signal to desired pins of the device under test and analyzing the response signals from desired pins. With recent advancements in technology, integrated circuits may have hundreds of pins. Consequently, the test equipment may have hundreds of duplicate driver and comparator circuits, one or more of each being associated with each pin of the circuit being tested. The test equipment also includes timing generators for supplying timing information for the test signals to be applied to the pins, and formatting circuits for producing patterns of test signals.

Under control of the test system computer and its programs, the test equipment can perform tests on a variety of integrated circuit devices. In each test an array of stimuli signals are applied to pins of the device under test, and the array of responses analyzed. Generally, the stimuli signals travel to each pin by a different path in the system. Similarly, the response signals from the device under test follow different paths from the output pins to the circuitry where the signals are analyzed. Because of the substantial differences in propagation delay and other detrimental influences on signal timing, it is essential to precisely control the timing of signals which are desired to arrive at the device under test at precise times or in synchronization or to be received from such device. In addition it is desirable to control the timing of signals more precisely than specified than by the clock generator of the system. Timing variations which adversely impact these goals must be corrected to assure the validity of the tests performed.

Timing errors of all types, other than cross-talk, are collectively termed "skew" herein. In an early approach to deskewing signals, a number of manually adjustable potentiometer were associated with each pin for aligning the signals. The potentiometers were readjusted whenever the equipment required recalibration, often daily or more frequently. Obviously the time and labor involved render this approach extremely undesirable.

Another approach, not necessarily in the prior art, but described herein to enable better understanding of this invention, is described in copending U.S. Pat. No. 4,488,297, U.S. Pat. No. 4,488,297 entitled "Programmable Deskewing of Automatic Test Equipment", and assigned to the same assignee as the present invention, provides a system which can be programmed, in conjunction with a predetermined test, to automatically deskew the stimuli and response signals. Generally, that system includes a coarse deskew unit for rough adjustment followed by a fine deskew unit for fine adjustment. The coarse deskew unit includes a plurality of logic gates and a multiplexer. The coarse delay is determined by the number of gates through which the signal is transmitted. The fine deskew unit includes a delay line tapped along its length at intermediate intervals for connection to successive inputs of a multiplexer. After being transmitted through an appropriate number of gates to generate the coarse delay, the signal is supplied to the delay line in the fine deskew unit, and the appropriate input selectively connected to the multiplexer output. In this manner a plurality of discrete delay times can be achieved by selecting the number of delay-line segments through which the signal passes.

SUMMARY OF THE INVENTION

The present invention provides a method and apparatus for delaying an electrical signal and provides high resolution with accurate calibration. In one embodiment apparatus constructed in accordance with the invention includes a first delay means for delaying an electrical signal by multiples of a predetermined coarse delay interval and second means providing for finer adjustment of the coarse delay. The fine system comprises an integral number N of delay elements, the total delay of which provide a nominally predetermined delay interval having a duration greater than the coarse delay interval. The coarse and fine systems may be connected serially in either order—coarse first or fine first.

In the preferred embodiment a coarse system is first, and the finer vernier system further includes means for receiving a first delayed signal from the coarse delay means to pass the delayed signal through a selected series of the finer delay elements to provide a delayed signal having a delay which may include fractional portions of the fundamental coarse predetermined interval. Whereas in known fine delay systems the smallest delay interval is chosen to be an integral submultiple of the fundamental delay interval of the previous stage, in the present invention the smallest fine delay interval exceeds the nearest submultiple value by a small amount, and is therefore termed an "enhanced fine delay interval" herein. Because of the enhanced fine delay interval, manufacturing tolerances are more easily compensated. The apparatus eliminates the need for expensive laser-trim calibration in the process of fabricating the apparatus, and permits dynamic control of signal delays using software techniques.

In the preferred embodiment of the invention the first delay means comprises a multiplexer having an ECL differential input stage and a differential transmission line connected to that input stage. The attenuation problems normally encountered with a single-ended transmission line are avoided by the differential transmission line because the crossover point of the signals on the differential pair remains essentially constant despite attenuation for reasonable length delay lines.

In another embodiment of the invention the fine system includes a ramp generator and the coarse system a sequence of gates, each gate, when enabled, providing a specified delay. The maximum time delay of the ramp generator is set to be slightly longer than that of an individual gate.

BRIEF DESCRIPTION OF THE DRAWINGS

FIG. 1 is a block schematic diagram of a delay apparatus for delaying signals by a desired amount.

FIG. 2 is a schematic diagram of a differential multiplexer input stage with differential transmission lines connected thereto.

FIG. 3 is a block schematic diagram of a differential multiplexer.

FIG. 4 is an alternate embodiment of a differential multiplexer.

FIG. 5 is an alternate embodiment of the delay apparatus.

FIG. 6 is a timing diagram for the apparatus of FIG. 5.

DETAILED DESCRIPTION OF THE PREFERRED EMBODIMENTS

FIG. 1 illustrates a four stage delay apparatus constructed in accordance with the invention. Each stage consists of a multiplexer and an associated delay line tapped at periodic intervals along its length. The taps are coupled to the input terminals of the multiplexers, and the determination of which input terminals is coupled to the output terminals of a particular multiplexer is set prior to arrival of the signal to be delayed by address signals supplied on lines $A_0$ through $A_9$. Each multiplexer receives a clock signal C which controls storage of the address signals within the multiplexer.

In the preferred embodiment the first multiplexer 14 comprises a 4:1 differential multiplexer connnected to a differential transmission line 15 terminated by well known terminator 13. A second multiplexer 16, also a 4:1 differential multiplexer, is cascaded from multiplexer 14, and also coupled to transmission line 17 which is terminated by well known terminator 18. One output line O from differential multiplexer 16 is coupled to the first input terminal of 8:1 multiplexer 22. The other output line is coupled to a terminator. Multiplexer 22 includes a single-ended transmission line 23 tapped at intervals along its length and having it end coupled to terminator 24. The output signal O from multiplexer 22 is coupled, in turn, to the first input terminal of 8:1 multiplexer 20 having taps to single-ended delay line 21 coupled to its input terminals. The end of delay line 21 is coupled to terminator 19. True and complementary output terminals out supply the ultimate accurately delayed signals.

The circuit shown in FIG. 1 operates to delay a signal supplied to it by a desired amount as follows. True and complementary input signals are supplied to nodes IN directly coupled to the first input terminal of multiplexer 14. Typically terminals IN are coupled to receive a timing signal generated under control of the test system computer. In response to the most significant address bits $A_9$ and $A_8$ previously supplied to multiplexer 14, one pair of the input terminals of multiplexer 14 will be coupled to the pair of output terminals O. As shown schematically in FIG. 1, if the first pair of input terminals A is coupled to the output terminals O, the signal supplied to terminals IN will pass through the minimum amount of delay line 15, and therefore be delayed a minimum amount of time. On the other hand, if as a result of the signals on address lines $A_9$ and $A_8$, input terminals C have been coupled to output terminals O, then the signals supplied at terminals IN will pass through several loops of the delay line, and accordingly be further delayed before reaching output terminals O.

Each of the multiplexers depicted in FIG. 1 operates in a manner like that described for multiplexer 14. For example, multiplexer 22 will delay the arrival of a signal at its output terminals O by an amount depending upon which input terminal of multiplexer 22 is coupled to its output terminal. Which input terminal is coupled to the output terminal is determined by the address information previously supplied on lines $A_3$, $A_4$, and $A_5$. This address information determines the length of delay line 23 through which the signals supplied to multiplexer 22 must pass before being coupled to the output terminal of that multiplexer.

In cascaded arrangements of coarse and fine vernier stages, the coarser stage usually provided a plurality of delay intervals each of which was an integral multiple of a fundamental predetermined delay interval. The finer vernier stage would then divide the fundamental delay interval of the coarse stage into a desired number of equal-duration time intervals to provide predetermined submultiples of the fundamental delay intervals. In this manner the usual fine cascaded vernier stage having, say, seven delay elements would provide further delays of $\frac{1}{8}$, 2/8, $\frac{3}{8}$, etc., of the coarser preceding delay interval. Of course, if the signal passes serially through all stages the order of the stages may be changed and the fine stages placed ahead of the coarser stages.

In the present invention one or more subsequent delay stages provide fractional portions of the previous stage's fundamental delay interval which are only nominally predetermined. For example, where an 8 stage vernier system would subdivide the previous coarser-stage fundamental delay interval into eighths, the vernier system of the present invention may provide eight segments, but each segment provides a delay greater than $\frac{1}{8}$ of the previous-stage fundamental delay. Thus, in the embodiment of FIG. 1 the segments of transmission line 23 between successive taps to multiplexer 16 each have a length which causes a delay greater than one-eighth of the individual delay interval of multiplexer 16. In the preferred embodiments in a vernier stage with divisions of "one-eighth," the delay provided by each segment is increased by about 25 percent, although the precise amount of enhancement is not critical. For a vernier stage with divisions of "one-fourth," the corresponding enhancement is also about 25 percent.

In the preferred embodiment of the system depicted in FIG. 1, the true and complement signals arrive at terminals IN with a resolution on the order of 5 nanoseconds or better, and it is desired for the ultimate output signals supplied at terminal OUT to have an accuracy within on the order of 10 picoseconds. Table 1 below shows the timing steps effected by each address bit.

TABLE 1

| | | |
|---|---|---|
| $A_0$ | 10 ps | Stage 20 |
| $A_1$ | 20 ps | |
| $A_2$ | 40 ps | |
| $A_3$ | 62 ps | Stage 22 |
| $A_4$ | 124 ps | |
| $A_5$ | 248 ps | |
| $A_6$ | 400 ps | Stage 16 |
| $A_7$ | 800 ps | |
| $A_8$ | 1.25 ns | Stage 14 |
| $A_9$ | 2.5 ns | |

The fractional portions provided by the present vernier system, for example stage 22 relative to stage 16, are referred to herein as "nominally predetermined" because they are not precisely predetermined. In the first approximation they subdivide the previous-stage fundamental delay interval into equal portions, but in accordance with the invention each delay element of the vernier system is increased by a desired amount. This small enhancement allows for correction of tolerances in the process by which the individual stages are fabricated. Of course the first stage of the cascaded arrangement will be divided into any desired number of segments without compensation.

In the preferred embodiment transmission lines 15, 17, 21 and 23 are conductive regions printed or otherwise formed on a ceramic substrate, on a printed circuit board, or on other suitable substrates. These regions are connected to the terminals of the multiplexers using well known techniques.

Previously, the segments of the vernier system delay line were equal to one another within a high degree of accuracy relative to the desired resolution and had a precise predetermined length to assure the proper vernier division. This was achieved by fabricating the vernier system delay line with a plurality of shorting bars, appropriate ones of which were then burned away by a laser to provide the desired delay. In the present construction, however, no laser trimming is necessary.

In the preferred embodiment the first two delay stages include multiplexers 14, 16 and delay lines provided by differential transmission lines 15, 17. The differential transmission lines are preferably provided by a pair of substantially parallel conductive traces, usually formed into a serpentine path to conserve surface area, on a substrate adjacent the location where the multiplexer chip is attached.

One advantage of employing a differential transmission line may be understood by reference to FIG. 2, which shows an emitter coupled logic differential input stage 30, typically used in multiplexers 14, 16, 20, 22.

The two sides of transmission line 15 are connected to the bases of transistor Q1 and Q2 across load resistors R1 and R2. In a typical single-ended arrangement the transmission line is connected only to the base of transistor Q1, and an internally generated reference voltage is applied to the base of transistor Q2. In the single-ended arrangement the signal to be delayed is thus compared with the internally generated reference voltage and the difference is amplified.

As is well known, a signal traveling along a transmission line is attenuated due to the effects of the distributed resistance of the line itself. The distributed resistance of a single-ended transmission line increases with the length of the line and also depends upon the cross-sectional profile of the line and substrate. The resistance of the line and the load resistor R1 in effect define a voltage divider. When the distributed resistance is a significant fraction of the load resistance, a false comparison with the internally generated reference voltage may result, yielding an erroneously delayed signal. This problem is overcome by the use of differential transmission lines 15 and 17. In the preferred manner of operation the signal to be delayed is applied to one side of transmission line 15, 17 and a complementary signal applied to the other. Both signals will then be subject to substantially the same attenuation, so that for lines of reasonable length, the output crossover will occur a fixed time after the input crossover and no false comparison will result.

A preferred embodiment of differential multiplexers 14 and 16 are shown in FIG. 3. For convenience, the circuit of FIG. 3 will be described in conjunction with multiplexer 14, however, it will be understood that the circuit is equally applicable to the construction of multiplexer 16, as well as other constructions. The circuit shown in FIG. 3 includes four pairs of transistors Q3-Q10, each pair having commonly coupled emitters in the manner shown. Each pair of transistors is coupled to a corresponding pair of input terminals of multiplexer 14. For example, the base of transistor Q5 is coupled to one terminal of the second pair of input terminals B of multiplexer 14, while the base of transistor Q6 is coupled to the other of pair B.

Using a well known decoder (not shown) address inputs $A_9$ and $A_8$ are decoded into four signals $S_0$, $S_1$, $S_2$, and $S_3$. For any given condition of the pair of address lines $A_9$ and $A_8$ and only one of signals $S_0$ through $S_3$ will be high, and correspondingly only one of transistors Q11-Q14 will be coupled to supply $V_{EE}$ through current source transistor Q15. Accordingly, the input signal received at only one of the pairs of input terminals A, B, C and D will be coupled to the output terminals O and $\overline{O}$.

Another embodiment for addressable multiplexers 14 or 16 having differential inputs and a differential output is illustrated in FIG. 4. The circuit includes differential complementary input pairs 31-34, which can be selectively connected to differential output pair 36. The addressing of inputs 31-34 by means of clocked address lines $A_9$ and $A_8$ (or $A_7$ and $A_6$) is well known. The circuit shown in FIG. 4 also contains an independent buffer circuit 37 having an input pair 38 and output pair 39. In the preferred embodiment buffer circuit 37 is interposed between the In terminals of FIG. 1 and a preceding transmission-line driver circuit (not shown). Buffer circuit 37 makes the input signal independent of the external driver circuit characteristics.

The dynamically controllable timing apparatus of FIG. 1 is calibrated in the following manner, which may be called a "software trim" in distinction to the prior art laser trim. A signal and its complement, to be delayed are applied to nodes IN, and the first tap of all stages is addressed by the respective multiplexers and connected to the respective multiplexer outputs. The propagation delay of the circuit is measured and serves as a reference time. This signal will represent the minimum delay condition. Each of the multiplexers are then stepped through their various addresses so as to selectively connect the multiplexer inputs to their respective outputs in a selected number of combinations, and the resulting time delays are measured. The measured delay associated with each combination of addresses is stored in the memory of the test system computer. In this manner a discrete transfer function for the overall delay apparatus is created. The calibration of the delay apparatus will then be fixed and always readily available from the memory.

FIG. 5 is a logical schematic of another embodiment of a deskew element 110 which may be incorporated into critical timing paths in automatic test equipment. In its broadest sense, the operation of deskew element 110 is to take an incoming pulse at a differential input 112, delay it by a variable amount of time according to the digital code at a multi-bit data input 115, and present the delayed signal at a differential output 117.

While particular timing parameters will be described in conjunction with the apparatus of FIG. 5, it is to be understood that the present invention is not so limited. Deskew element 110 is designed to take an incoming pulse of 5-ns width at a 20-ns repetition rate, and to provide a variable increment of delay in the range of 0–5.12 ns from nominal in steps of approximately 10 ps. To this end, the deskew element has the capability of providing an overall delay of 8.2 ns, as described below.

The main components of deskew element 110 are fine delay circuitry 120, coarse delay circuitry 122, latching circuitry 125, and a 7-bit digital/analog converter ("DAC") 130. Data input 115 has ten bits, seven bits of which (B0–B6) are communicated to the inputs of DAC 130; the remaining three bits (B7–B9) are communicated (as complementary pairs) to coarse delay circuitry 122. DAC 130 produces an analog voltage of 0.25–1.25 volts corresponding to the 7-bit code at its input, and a voltage derived from this is communicated to fine delay circuitry 120. The particular construction of latching circuitry 125 and DAC 130 is not directly related to the present invention, and is well known. Furthermore, because the coarse delay circuitry 122 and fine delay circuitry 120 are cascaded, they could be coupled together in reverse order.

Fine delay circuitry 120 includes a differential receiver 132, first and second ramp generators 133 and 133', and a reconstruction (set/reset) latch 135. Broadly, fine delay circuitry 120 takes the differential input pulses and splits the leading and trailing edges into ramp generators 133 and 133' which compare those edges with a threshold derived from the DAC output voltage. Ramp generators 133 and 133' comprise respective capacitors 137 and 137' and respective comparators 138 and 138'. After the ramp voltages are sensed by comparators 138 and 138', the pulse is reconstructed by reconstruction latch 135. Edge timing in fine delay circuitry 20 is approximately 800 mv/ns, whereupon the 1-volt variation in the output voltage from DAC 130 provides up to approximately 1.25 ns of controlled fine delay variations.

Latch 135 includes cross-coupled gates 140 and 141 which receive as set and reset inputs the signals from comparators 138 and 138'. The output from comparator 138 is also communicated to a first input of a gate 143. The respective outputs of gates 141 and 143 are communicated to a latch output gate 145, the differential outputs of which communicate to coarse delay circuitry 122 and also communicate via a feedback gate 147 to a second input of gate 143.

The pulse, as reconstructed at the output of gate 145, is communicated to coarse delay circuitry 122. Coarse delay circuitry 122 includes a delay line 150 comprising cascaded gate stages 150(1), 150(2), ... and 150(7), the respective outputs of which also communicate to respective multiplexer output gates 152(1), 152(2), ... and 152(7). A dummy gate 150(8) ensures that the capacitance is the same at the outputs of all the gates in delay line 150. The reconstructed pulse communicates to the input of gate 150(1), and also to a multiplexer output gate 152(0). The outputs of all output gates 152(0-7) are tied to an output buffer 155. Each gate in delay line 150 produces a 1-ns delay, for a total of up to 7 ns of coarse delay, depending on which of output gates 152(0-7) is selected by bits B7–B9 of the data inputs which are coupled to enable terminals E on each gate 152.

The preferred embodiment of the present invention is implemented in emitter coupled logic ("ECL") and is described in detail in U.S. patent application Ser. No. 611,454, now allowed, filed the same date as this application, entitled "Multiple-Stage Gate Network" and commonly assigned. In accordance with known practice, each gate stage includes a differential transistor pair having the transistors' emitters coupled to a common circuit point, and a current source coupled thereto. The transistors' collectors are resistively coupled to a supply voltage, and at least one of the transistors; collectors is coupled through an emitter follower to an output terminal. The relative current flow through the transistors (and hence the relative collector voltage) is determined by the relative voltages at the transistors' bases.

For a differential input signal, the two components are communicated to the bases; for a single-sided signal, one base receives the signal and the other base is held at a threshold voltage. The threshold voltage may be a nominally fixed reference level (as in gates 140, 141, 143, and 145) or a controlled signal reference (as in comparators 138 and 138'). The emitter follower stages through which the output signals are coupled use constant current sources for their loads.

The operation of fine delay circuitry 120 may best be understood with reference to FIG. 6 which is the timing diagram showing the signals at nodes A–H in the circuitry. The nodes are defined as follows:

A - input to comparator 138
B - output from comparator 138
C - input to comparator 138'
D - output from comparator 138'
E - output from gate 140
F - output from gate 141
G - output from gate 143
H - output from gate 145
I - output from gate 147

For purposes of illustration, the input signal may be assumed to be a 5-ns wide pulse having differential components IN+ and IN−. In the discussion that follows, it will be assumed that each gate except feedback gate 147 provides a fixed increment of delay, designated δ, which is approximately 1 ns. Feedback gate 147 is characterized by a longer gate delay, designated δ', which is approximately 2 ns.

The positive input signal IN+ is communicated through differential input gate 132 to node A. Since the input gate has an emitter follower, the rise in IN+ causes a rapid rise at node A, one gate delay later. However, the fall in IN+ does not result in a rapid fall at node A, but rather a more gradual fall which has a slope defined by the load current and the capacitor value. Thus, the fall at node A is linear with a fall time of approximately 1.5 ns. For purposes of illustration, it will be assumed that the voltage at node A becomes equal to the DAC voltage a time interval Δ after the voltage at A begins to fall.

Consider now the signal at node B. Comparator 138 introduces one gate delay as well as inversion. When A rises, B falls one gate delay later. B rises one gate delay after A falls to a level matching the voltage of DAC 130. The trailing (rising) edge of the signal at B is one of the two edges that is ultimately reconstructed into the delayed pulse.

Similary, the negative input signal IN— produces a signal at node C which has a leading (falling) edge having a slope defined by the constant current source and the capacitor, and a trailing (rising) edge that rises rapidly. As above, where the voltage at C reaches the DAC voltage after an interval Δ, the rising edge at node D occurs one gate delay later, and the trailing edge occurs one gate delay after C rises. The leading (rising) edge of the signal at D is the other edge that is ultimately reconstructed.

Gates 140 and 141 define a set/reset latch whose state changes each time either B or D goes high. Thus, since it is the rising edges of the signals at B and D that are to be reconstructed, the latch has the effect of reconstructing the pulse. The signals at B and D follow different paths prior to being reconstructed at H. When D rises, F falls one gate delay later, and then H falls one more gate delay later, thereby reconstructing the leading edge of D (which corresponds to the delayed leading edge of the input signal). The signal at B follows a slightly different path prior to reaching to node H. Rather than go through the latch which would add an extra delay, a look-ahead path is utilized. The signal at B is propagated through gate 143, whereupon G rises one gate delay after B rises, and H rises one more gate delay later to reconstruct the trailing edge of B (which corresponds to the delayed trailing edge of the input signal). However, the rise in H is propagated through the feedback network (characterized by the longer gate delay) to I (one of the inputs of gate 143) which causes F to fall. Thus, when B rises, G rises, but then falls a short time later because of the feedback. However, by that time, B has risen and has reset latch 135. F rises again and reinforces G so that by the time G falls, F has risen to keep H high. In this manner, the outputs at gate 145 are delayed relative to the differential input signal by a variable amount Δ (in addition to four fixed gate delays).

In summary, it can be seen that the apparatus of the present invention can be fabricated compactly. Better resolution may be obtained, and the delay apparatus can be calibrated accurately without resorting to laser trimming or other expensive manufacturing processes. The apparatus permits dynamic control of signal timing and enables the combination of less accurate multiplexers to obtain a more accurate result.

Other embodiments of the invention could include obvious variations of the apparatus described. For example, other types of variable delay elements may be used in place of the multiplexer-delay line combinations illustrated by the preferred embodiment. Therefore, the above description and illustration should not be construed as limiting the scope of the invention, which is defined by the appended claims.

We claim:

1. Apparatus connected between an input terminal and an output terminal for delaying an electrical signal supplied to the input terminal before supplying it to the output terminal, the apparatus comprising:
first means for delaying signals by a selected multiple of a first nominally predetermined delay interval, the first means connected to the input terminal to receive the electrical signal and delay it by passing it through a delay line to provide a first delayed signal at a first node;
N delay elements, where N is an integer greater than one, each element providing a second nominally predetermined delay interval which is greater than the first nominally predetermined delay interval divided by N, and wherein the N delay elements include a second delay line having a plurality of taps at intervals thereon;
second means connected to the first node to receive the first delayed signal, connected to the output terminal, and connected to the N delay elements, the second means being operable to pass the first delayed signal through a selected series of the N delay elements to thereby further delay the first delayed signal to provide a second delayed signal to the output terminal.

2. Apparatus as in claim 1 wherein the first means comprises:
first multiplexing means having a plurality of input terminals; and
a first transmission line having a plurality of taps at intervals thereon, each tap connected to a successive input terminal of the first multiplexing means.

3. Apparatus as in claim 2 wherein the second means comprises:
second multiplexing means having a plurality of input nodes; and
wherein the N delay elements comprise a second transmission line having the plurality of taps at intervals thereon, each tap connected to a successive input node of the second multiplexing means.

4. Apparatus as in claim 2 wherein the first multiplexing means includes addressable controls for selectively connecting one of the taps on the first transmission line to the first node.

5. Apparatus as in claim 4 wherein the first multiplexing means comprises a first multiplexer including differential input stages, and the first transmission line comprises a differential transmission line connected to the differential input stages.

6. Apparatus as in claim 5 wherein termination means are provided following a last input terminal of the first multiplexer to terminate the first transmission line.

7. Apparatus as in claim 3 wherein the second multiplexing means includes addressable controls for selectively connecting one of the taps on the second transmission line to the output terminal.

8. Apparatus as in claim 1 further comprising:

a set of M delay elements, where M is an integer, each element providing a third nominally predetermined delay interval, which third nominally predetermined delay interval is greater than the second nominally predetermined delay interval divided by M; and third means connected between the output terminal and the second means to receive the second delayed signal from the second means, and connected to the M delay elements, the third means being operable to pass the second delayed signal through a selected series of the M delay elements and delay it to provide a third delayed signal to the output terminal.

9. Apparatus as in claim 7 wherein:

the third means comprises a third multiplexing means having a plurality of input terminals and at least one third output terminal, and the set of M delay elements comprises a third transmission line having a plurality of taps at intervals connected to successive input terminals of the thrid multiplexer.

10. Apparatus for delaying an electrical signal comprising:

a first transmission line having M taps along its length, where M is an integer greater than one;

a first multiplexer having M input terminals, each connected to a different one of the M taps, the M taps dividing the first transmission line into M-1 segments, wherein the M taps are positioned to delay an electrical signal passing along the first transmission line by a first predetermined delay interval between successive taps, the first multiplexer providing a first delayed signal at a first multiplexer output terminal;

a second transmission line having N taps along its length, where N is an integer greater than one, the second transmission line being connected to receive the first delayed signal from the first multiplexer output terminal;

a second multiplexer having N input terminals, each connected to a different one of the N taps, the N taps dividing the second transmission line into N-1 segments, wherein the N taps are positioned to delay an electrical signal passing along the second transmission line by a second predetermined delay interval between successive taps, the second multiplexer providing a second delayed signal at a second multiplexer output terminal; and wherein the delay of the N-1 segments combined is greater than the delay of a single segment of the first transmission line.

11. Apparatus for delaying an electrical signal comprising:

first means for delaying signals by a preselected interval, the first means connected to receive the electrical signal and delay it for up to a predetermined delay interval to provide a first delayed signal;

N serially connected delay elements, where N is an integer, coupled to receive the first delayed signal and further delay it by transmitting the first delayed signal through a predetermined number of the N delay elements and supply it to an output terminal; and wherein the first means comprises ramp generating means and the delay elements comprise gate means.

12. Apparatus as in claim 10 further comprising control means receptive to data input signals and coupled to each of the ramp generating means and the gate means for controlling both in response to the data input signals.

13. Apparatus connected between an input terminal and an output terminal for delaying an electrical signal supplied to the input terminal before supplying it to the output terminal, the apparatus comprising:

a first delay line having a plurality of fine taps at intervals thereon, the fine taps dividing the first delay line into a series of fine segments, each segment providing a fine nominally predetermined delay interval, all of the series of fine segments of the first delay line together providing a total fine delay period;

fine delay means connected to the input terminal to receive the electrical signal, connected to a first node, and connected to each of the fine taps, the fine delay means being operable to pass the electrical signal through a selected series of the fine segments to delay the electrical signal and thereby provide a first delayed signal at the first node;

a second delay line having a plurality of coarse taps at intervals thereon, the coarse taps dividing the second delay line into a series of coarse segments, each segment providing a coarse nominally predetermined delay interval which is less than the total fine delay period; and coarse delay means connected to the first node to receive the first delayed signal, connected to the output terminal, and connected to each of the coarse taps, the coarse delay means being operable to pass the first delayed signal through a selected series of the coarse segments to delay the first delayed signal and thereby provide a second delayed signal to the output terminal.

* * * * *